(12) United States Patent
Bowen et al.

(10) Patent No.: US 9,362,488 B2
(45) Date of Patent: Jun. 7, 2016

(54) SPIN INJECTOR DEVICE COMPRISING A PROTECTION LAYER AT THE CENTRE THEREOF

(71) Applicants: CENTRE NATIONAL DE LA RECHERCHE SCIENTIFIQUE, Paris (FR); UNIVERSITE DE STRASBOURG, Strasbourg (FR)

(72) Inventors: Martin Bowen, Kehl (DE); Mébarek Alouani, Wolfisheim (FR); Samy Boukari, Horbourg-Wihr (FR); Eric Beaurepaire, Vendenheim (FR); Wolfgang Weber, Kehl (DE); Fabrice Scheurer, Behlenheim (FR); Loïc Joly, Oberhausergen (FR)

(73) Assignees: Centre National de la Recherche Scientifique, Paris (FR); Universite de Strasbourg, Strasbourg (FR)

(*) Notice: Subject to any disclaimer, the term of this patent is extended or adjusted under 35 U.S.C. 154(b) by 0 days.

(21) Appl. No.: 14/394,472

(22) PCT Filed: Apr. 15, 2013

(86) PCT No.: PCT/EP2013/057769
§ 371 (c)(1),
(2) Date: Oct. 14, 2014

(87) PCT Pub. No.: WO2013/156426
PCT Pub. Date: Oct. 24, 2013

(65) Prior Publication Data
US 2015/0072442 A1  Mar. 12, 2015

(30) Foreign Application Priority Data

Apr. 18, 2012 (FR) ................................. 12 53569

(51) Int. Cl.
*H01L 43/12* (2006.01)
*H01F 10/32* (2006.01)
(Continued)

(52) U.S. Cl.
CPC ............. *H01L 43/12* (2013.01); *H01F 10/005* (2013.01); *H01F 10/3254* (2013.01); *H01F 41/32* (2013.01); *H01L 43/10* (2013.01)

(58) Field of Classification Search
USPC .............................................. 438/3
See application file for complete search history.

(56) References Cited

U.S. PATENT DOCUMENTS

| 6,852,555 B1 | 2/2005 | Roman et al. | |
| 2006/0057743 A1* | 3/2006 | Epstein | B82Y 10/00 438/3 |

(Continued)

FOREIGN PATENT DOCUMENTS

| WO | 02/35715 | 5/2002 |
| WO | 2006/022859 A2 | 3/2006 |

OTHER PUBLICATIONS

Aristov et al., "Ferromagnetic Cobalt and Iron Top Contacts on an Organic Semiconductor: Evidence for a Reacted Interface"; Organic Electronics, Elsevier, Amsterdam, NL; vol. 10 No. 1; Feb. 1, 2009; pp. 8-11.

(Continued)

*Primary Examiner* — Asok K Sarkar
(74) *Attorney, Agent, or Firm* — Nixon Peabody LLP; Khaled Shami

(57) ABSTRACT

A method for manufacturing a spin injector device, comprising the following steps of:
 a) forming a metal protection layer on a face of a substrate, so as to restrict or prevent oxidation and/or contamination of said face by its environment, the face being magnetic and electrically conductive, the protection layer being of a diamagnetic or paramagnetic nature;
 b) forming an upper layer onto the protection layer, able to promote a spin bias of electronics sates in the vicinity of the Fermi level of the interface between the protection layer and the upper layer according to an amplitude and a spin referential frame which are defined by the magnetism of the substrate and/or of the face of the substrate, the upper layer being an organic layer of which one or more molecular sites have, in contact with the protection layer, a paramagnetic moment.

13 Claims, 2 Drawing Sheets

(51) Int. Cl.
H01F 10/00 (2006.01)
H01F 41/32 (2006.01)
H01L 43/10 (2006.01)

(56) References Cited

U.S. PATENT DOCUMENTS

| | | | |
|---|---|---|---|
| 2007/0082230 | A1 | 4/2007 | Shi et al. |
| 2008/0152952 | A1 | 6/2008 | Santos et al. |
| 2009/0011284 | A1 | 1/2009 | Wang et al. |
| 2012/0058367 | A1* | 3/2012 | Fukuma ............ H01L 29/66984 428/811.2 |
| 2015/0129994 | A1 | 5/2015 | Bowen et al. |

OTHER PUBLICATIONS

Bergenti et al., "Transparent Manganite Films as Hole Injectors for Organic Light Emitting Diodes"; Journal of Luminescence, Elsevier, BV North-Holland, NL; vol. 110, No. 4; Dec. 12, 2004; pp. 384-388.

Santos et al., "Room-Temperature Tunnel Magnetoresistance and Spin-Polarized Tunneling Through an Organic Semiconductor Barrier"; Physical Review Letters, American Physical Society, New York, U.S.; vol. 98, No. 1; Jan. 1, 2007; 4 pp.

International Search Report for Application No. PCT/EP2013/057769 mailing date May 10, 2013.

Alves, H. et al., "Metallic conduction at organic charge-transfer interfaces", Nature Materials, vol. 7, pp. 574-580, published online Jun. 2008.

Barraud, C. et al., "Unravelling the role of the interface for spin injection into organic semiconductors", Nature Physics, vol. 6, pp. 615-620, Aug. 2010.

Bonnel, F. et al., "Consequences of interfacial Fe—O bonding and disorder in epitaxial Fe/MgO/Fe 001) magnetic tunnel junctions", Physical Review B, vol. 79, pp. 224405-1-224405-10, Jun. 2009.

Bowen, M. et al, "Observation of Fowler-Nordheim hole tunneling across an electron tunnel junction due to total symmetry filtering", Physical Review B, vol. 73, pp. 140408-1-140408-4, Apr. 2006.

Bowen, M. et al., "Using half-metallic manganite interfaces to reveal insights into spintronics", Journal of Physics: Condensed Matter, vol. 19, pp. 1-27, Aug. 2007.

Carbone, C. et al., "Exchange Split Quantum Well States of a Noble Metal Film on a Magnetic Substrate", Physical Review Letters, vol. 71, No. 17, pp. 2805-2808, Oct. 1993.

Cinchetti, M. et al., "Determination of spin injection and transport in a ferromagnet/organic semiconductor heterojunction by two-photon photoemission", Nature Materials, vol. 8, pp. 115-119, Feb. 2009.

Dedkov, Y.S. et al., "Graphene-protected iron layer on Ni(111)", Applied Physics Letters, vol. 93, pp. 022509-1-022509-3, published online Jul. 2008.

Faure-Vincent, J. et al., "Interlayer Magnetic Coupling Interactions of Two Ferromagnetic Layers by Spin Polarized Tunneling", Physical Review Letters, vol. 89, No. 10, Sep. 2002, pp. 107206-1-107206-4.

Fert, A. "Origin, Development, and Future of Spintronics (Nobel Lecture)", Angewandte Chemie International Edition, vol. 47, No. 32, pp. 5956-5967, Jul. 2008.

Gudat, W. et al., "Spin Polarized Energy-Resolved Photoemission From Ni(111) Using Synchotron Radiation", Solid State Communications, vol. 37, No. 10, pp. 771-775, Mar. 1981.

Hamman, C. et al. "Ultrahigh vacuum deposition of organic molecules by electrospray ionization", Review of Scientific Instruments, vol. 82, pp. 033903-1-033903-6, published online Mar. 2011.

Huijben, M. et al. "Structure-Property Relation of SrTiO3/LaAlO3 Interfaces", Advanced Materials, vol. 21, pp. 1665-1677, May 2009.

Javaid, S. et al., "Impact on Interface Spin Polarization of Molecular Bonding to Metallic Surfaces", Physical Review Letters, vol. 105, pp. 077201-1-077201-4, Aug. 2010.

Katayama, T. et al., "Interlayer exchange coupling in Fe MgO Fe magnetic tunnel junctions", Applied Physics Letters, vol. 89, pp. 112503-1-112503-3, published online Sep. 2006.

Kawakami, R.K. et al., "Observation of the Quantum Well Interference in Magnetic Nanostructures by Photoemission", Physical Review Letters, vol. 80, No. 8, Feb. 1998, pp. 1754-1757.

Lach, S. et al., "Metal-Organic Hybrid Interface States of a Ferromagnet/Organic Semiconductor Hybrid Junction as Basis for Engineering Spin Injection in Organic Spintronics", Advanced Functional Materials, vol. 22, pp. 989-997, Mar. 2012.

Lauhoff, G. et al., "Origin of the Co uniaxial volume anisotropy of the fcc Co Ni Cu 001) System", Physical Review B, vol. 60, No. 6, Aug. 1999, pp. 4087-4091.

Lee, Y.M. et al., "Effect of electrode composition on the tunnel magnetoresistance of pseudo spin valve magnetic tunnel junction with a MgO tunnel barrier", Applied Physics Letters, vol. 9, pp. 212507-1-212507-3, published online May 2007.

Methfessel, T. et al., "Spin scattering and spin polarized hybrid interface states at a metal organic interface", Physical Review B, vol. 84, pp. 224403-1-224403-7, Dec. 2011.

Milun, M. et al., "Quantum Well Structures in Thin Metal Films: Simple Model Physics in Reality?", Reports on Progress in Physics, vol. 65, pp. 99-141, Jan. 2002.

Niklasson, A.M.N. et al. "Quantum-well-induced ferromagnetism in thin films", Physical Review B, vol. 56, No. 6, Aug. 1997, pp. 3276-3280.

Paggel, J.J. et al., "Quantum well photoemission from atomically uniform Ag Films: determination of electronic band structure and quasi-particle lifetime in Ag(100)", Applied Surface Science, vols. 162-163, pp. 78-85, Aug. 2000.

Park, B.G. et al., "Tunnel spin polarization of Ni80Fe20/SiO2 probed with a magnetic tunnel transistor", Physical Review B, vol. 73, pp. 172402-1-172402-4, May 2006.

Qui, Z.Q. et al., "Quantum well states and oscillatory magnetic interlayer coupling", Journal of Physics: Condensed Matter, vol. 14, pp. R169-R193, Feb. 2002.

Ruben, M. et al., "Grid-Type Metal Ion Architectures: Functional Metallosupramolecular Arrays", Angewandte Chemie International Edition, vol. 43, pp. 3644-3662, Jul. 2004.

Sanvito, S., "The rise of spinterface science", Nature Physics, vol. 6, Aug. 2010, pp. 562-564.

Schmaus, S. et al., "Giant magnetoresistance through a single molecule", Nature Nanotechnology, vol. 6, published online Feb. 2011, pp. 185-189.

Schneider, C.M. et al. "Curie Temperature of Ultrathin Films of fcc Cobalt Epitaxially Grown on Atomically Flat C (100) Surfaces", Physical Review Letters, vol. 64, No. 9, Feb. 1990, pp. 1059-1063.

Wende, H. et al., "Substrate induced magnetic ordering and switching of iron porphyrin molecules", Nature Materials, vol. 6, pp. 516-520, published online Jun. 2007.

Xiong, Z.H. et al., "Giant magnetoresistance in organic spin-valves", Nature, vol. 427, pp. 821-824, Feb. 2004.

International Search Report for PCT/EP2013/057804, dated May 14, 2013.

Kurahashi, M. et al. "Temperature dependence of the magnetization of Fe films on Cu (100) studied by SPMDS and SMOKE: effects of relaxation", Surface Science, vol. 552, pp. 193-198, Mar. 2004.

* cited by examiner

SPIN INJECTOR DEVICE COMPRISING A PROTECTION LAYER AT THE CENTRE THEREOF

CROSS-REFERENCE TO RELATED PATENT APPLICATION

The present application is a National Stage Application of International Application No. PCT/EP2013/057769 entitled "SPIN INJECTOR DEVICE COMPRISING A PROTECTION LAYER AT THE CENTRE THEREOF" filed Apr. 15, 2013, which claims benefit of priority to French patent Application No. 12 53569 filed on Apr. 18, 2012. Both of these applications are incorporated herein by reference in their entirety.

TECHNICAL FIELD

The present application relates to the technical field of electronics, more precisely that of spintronics. The invention particularly relates to a method of manufacturing a spin injector device, enabling electrons passing through it to be filtered, depending on the orientation of their spin.

STATE OF PRIOR ART

Technological advances made in the semi-conductor industry allow to considerably reduce the dimensions of electronic devices, thus increasing their power and complexity. Nowadays, manufacturing these devices in the atomic scale copes with new issues, in particular related to physical phenomena occurring at this scale. To further increase the performances of semi-conductor, it is thus necessary to develop devices based on novel concepts.

One of these concepts is to exploit the quantum property of the electrons' spin, in order to store information. This is the technical field of spintronics.

Electrons are characterised by several intrinsic values, in particular their angular momentum or spin. Because of the uncertainty principle of measurements at the atomic scale, the measurement of an electron spin is possible only according to one observable or direction, and its value can be positive or negative. These states are respectively called "spin up" and "spin down".

To exploit this characteristic in the industrial level, it is necessary to develop devices capable of selecting and/or reading the bias state of the electron spins. Devices enabling to select or filter electrons depending on the orientation of their spin, are called spin injector devices.

Presently, several spin injector devices are being developed. Some of these spin injectors exploit the tunnel effect to filter electrons. This effect is observed when a barrier, called a tunnel barrier, is sandwiched between two conductive elements. Physically, the tunnel barrier is a medium poorly promoting electron diffusion. This medium can thus be insulating or semi-conducting.

Quantum properties, such as for example the spin orientation of a particle, moving between two conductors by the tunnel effect, are preserved during this transport. It is then possible to use this property to transport information between two ferromagnetic conductive elements. The bias state of electrons, enabling information to be coded, can then be detected using a ferromagnetic conductor placed on the other side of the tunnel barrier, all of them forming a magnetic tunnel junction. By placing the device in a parallel or anti-parallel alignment state of both ferromagnetic layers magnetization, it is possible to measure the spin bias extent of the current passing through the device. Since the current goes from one electrode to the other, the functions of current spin bias and detection of this bias (or "reading") are assigned to each of both interfaces of the magnetic tunnel junction as a function of the sign of the current. The assignment of bias and detection of the current spin can then be inverted at the interfaces simply by changing the sign of the current passing through the device (Fert, Nobel Lectures 2008 Angew. Chem. Int. Ed. 2008, 47, 5956-5967).

The spin bias abilities of the magnetic tunnel junction can be increased tenfold by selecting a tunnel barrier having an electronic structure suitable for that of adjacent ferromagnetic electrodes. In this case, some wave functions of conduction electrons, which functions are highly spin biased within the ferromagnetic layer will pass more easily through the barrier, which results in a highly spin biased current (Bowen PHYSICAL REVIEW B 73, 140408R (2006)). This effect has for example been observed by sandwiching a magnesium oxide layer between two iron alloy layers (Appl. Phys. Lett. 90, 212507 (2007)).

Another way of development lies on the use of an organic layer as a tunnel barrier (Physical Review Letter 98, 016601 (2007)). Organic materials, because of their low atomic mass or number, as compared to that of inorganic materials, have the advantage of poorly interacting with the bias state of conduction electrons. Thus their spins are much less disturbed when they pass through this type of material. These materials thus seem to be very promising for future applications, such as biased spin injector devices (Nature 427 821 (2004)).

Recent studies have shown that a coupling phenomenon is necessary at said interfaces, to allow transmission of biased spins between a magnetic medium and an organic layer (Nature Material 6, 516(2007), Physical Review Letter 105, 077201(2010)). But, the transmission properties may be quickly degraded when the interfaces include impurities and/or are oxidized. More precisely, when the surfaces are oxidized, the order grade of the spins can be decreased, or even suppressed, because transition metal-based ferromagnetic electrodes can form in contact with oxygen present in air, oxides having disordered antiferromagnetic properties. In the field of inorganic spintronics, this can results in a decrease, or even a disappearance, of the spintronic performances of the device (Physical Review B79, 224405 (2009)). This is one of the causes limiting the use of this kind of device at an industrial level.

Currently, in order to prevent this oxidation phenomenon, a solution is to make the deposition of the organic layer, onto the magnetic substrate, in a controlled or non-oxidizing atmosphere environment, such as for example in a vacuum atmosphere. It should be noted herein that even the environment of a glove box, containing for example one part per million oxygen and/or water, may degrade the spintronic properties of a ferromagnetic layer.

Besides, only a limited subset of molecules can be sublimated under vacuum, whereas a huge set of molecules can be conditioned only in wet form, for example by dip-coating or spin-coating.

Another drawback resides in the fact that the composition of the deposited organic layers should not contain elements likely to interact with the magnetic layer, so as to degrade its spintronic properties. Among these elements, oxygen may be mentioned. This can, under some forms, degrade the spintronic properties by forming oxides of non-ordered transition metals with antiferromagnetic properties. These excluded elements are used in the composition of very numerous organic compounds. For this, current production techniques are restricted to some compositions only.

This is why, inter alia, spin injector devices, including an organic layer on a magnetic layer, are delicate to assemble, because of production environment requirements, and thereby restrain the type of molecule in the class of molecules vacuum sublimable.

One of the purposes of the present application is to enable the manufacturing of spin injector devices, including an organic layer:
- in less demanding environments;
- and/or with organic layers not excluding chemical elements as common as oxygen, because of the potential oxidation risk;
- and/or without oxidizing or contaminating the magnetic face facing the organic layer;
- the spin filtering rate of which is improved.

DISCLOSURE OF THE INVENTION

The object of the invention is to solve at least one of the preceding problems.

For this, there is provided a method for manufacturing a spin injector device, according to the following steps of:

a) forming a protection layer on a face or a first face of a substrate, so as to restrict or prevent oxidation and/or contamination of said face by its environment, the face may be magnetic and electrically conductive, the protection layer may be diamagnetic or paramagnetic; preferably, the protection layer is paramagnetic and includes a strong magnetic susceptibility;

b) forming an upper layer onto the protection layer, promoting the transfer of bias electrons between said layer and the face of the substrate.

The present invention further provides a method for manufacturing a spin injector device, comprising the following steps of:

a) forming a metal protection layer on a face of a substrate, so as to restrict or prevent oxidation and/or contamination of said face by its environment, the face of the substrate being magnetic and electrically conductive, the protection layer being of a diamagnetic or paramagnetic nature;

b) forming an upper layer onto the protection layer, which is able to promote a spin bias of electronic sates in the vicinity of the Fermi level of the interface between the protection layer and the upper layer according to an amplitude and a spin referential frame with are defined by the magnetism of the substrate and/or of the face of the substrate, the upper layer being an organic layer, one or more molecular sites of which having, in contact with the protection layer, a paramagnetic moment characterised by a single magnetic referential frame, fixed in space and time and based on, or corresponding to, a magnetic referential frame of the substrate and/or of the face of the substrate.

The protection layer is a layer which composition and structure are not or very little influenced by air and water, present in the atmosphere in contact with said protection layer. The protection layer may be metallic and, for example, made up of one or more noble metals, or for example by one or more of the following elements: copper, silver, gold. The magnetism of the substrate can thus give rise to a magnetism carried by the atoms of the protection layer/upper layer interface, by virtue of a magnetic indirect exchange coupling mechanism. As a result, there is a spin bias of the electrons around the Fermi level of these atoms of the protection layer/upper layer interface, that is a spin bias of the current intended to pass through this interface.

The physics of the indirect exchange coupling, which is related to a mechanism allowing the projection of the magnetism from the substrate through a non-magnetic layer, herein the protection layer, operates essentially regardless of whether it is a metal or insulating or even semi-conducting protection layer. However, whereas the effect will be mainly oscillatory in the case of a metal layer, it will have a highly evanescent essential feature (that is exponentially decreasing) in the case of an insulating or semi-conducting layer. The exchange coupling achieved through the metal protection layer is thus much better in terms of amplitude (about $10^9$ times higher) and intensity than through an insulating or semi-conducting layer, in particular considering layers having thicknesses higher than a monolayer (about 0.18 nm for a copper monolayer).

The paramagnetic moment exhibited by the molecular site(s) of the upper layer, in contact with the protection layer, may be seen as including a long-range magnetic order induced by the magnetism of the substrate, or even a magnetic order relating to ferromagnetism. A long-range magnetic order may be defined by a distance higher than the distances separating the first, or second, or third neighbouring atoms, surrounding an atom present at the molecular site(s).

The thickness of the protection layer, along a direction substantially perpendicular or perpendicular to the first face of the substrate, may be between one and one hundred thirty thicknesses of an atom layer making up said protection layer, but since the exchange field decreases when this thickness increases (Nanomagnetism: Ultrathin Films, Multilayers and Nanostructures Vol 1 Chap. 3 p. 61 (2006)), it is preferable that the thickness of the protection layer remains low. It may for example be between one and seven thicknesses of an atom layer making up the protection layer. An atom layer includes a single atom in its thickness direction.

The upper layer may be an organic layer or a layer including, for example, one or more of the following elements: carbon, nitrogen, oxygen, fluorine, boron, iron, cobalt, manganese, copper, vanadium, zinc, magnesium, silicon, etc. The upper layer may also include one of the following elements: sulphur, hydrogen, aluminium, potassium, chloride, sodium.

The protection layer may be of an insulating or semi-conducting nature.

It is preferable that a direct exchange magnetic field in the order of 1000 T may be established between the substrate and the upper layer when they are in contact, in order to bias at least one initially non-magnetic site at the upper layer (ex: a carbon site). The exchange magnetic field passing through the protection layer may not exceed a value in the order of 2 T. It may then be preferable that the upper layer includes at least one element having at least one non-zero paramagnetic moment, at least after the adsorption of the upper layer onto the protection layer. Preferably, the moment of the paramagnetic molecular site(s) may be saturated to at least 50%, by the indirect exchange magnetic field between the substrate and the upper layer. In order to amplify this exchange field at the interface between the protection layer and the upper layer, the thickness of the protection layer may be carefully controlled according to the electronic structure thereof (see hereinafter and detailed disclosure).

The upper layer may be an organic layer one or more molecular sites of which exhibit, in contact with the protection layer, a paramagnetic moment. A magnetic order may then be induced by an indirect exchange coupling occurring between the upper layer and the substrate via the protection layer. This magnetic order is common to all the atoms of the molecules forming the interface between the upper layer and the protection layer. This can give rise, if a current passes through the spin injector device and by virtue of the ferromagnetic alignment of the molecular plane (formed by said molecular site(s)) with the magnetic face of the substrate resulting from this exchange coupling, to a significant spin bias of this current passing through this molecular plane.

Because of the common magnetic order described above, the paramagnetic moment of each atom of the organic layer which is in contact with the protection layer may be aligned along the magnetic referential frame of the magnetic material of the substrate by virtue of the indirect exchange coupling between the substrate and the upper layer. Thus, when the substrate includes a ferromagnetic material, the magnetic moment induced to said molecular site(s) acquires a ferromagnetic property (by induced ferromagnetism). A spin biased current coming from the protection layer/upper layer interface can thus be obtained.

The method of manufacturing the spin injector device may further include making means for controlling the magnetism of the substrate and/or of the face of the substrate. Such means can enable to control the magnetic referential frame (intensity), and thus the spin referential frame (bias) of the molecular layer (upper layer), by acting on the magnetic referential frame (intensity) of the substrate. This may for example be achieved via means enabling to apply a magnetic, electrical, electromagnetic field, a mechanical expansion and/or contraction to the substrate, or even a temperature change of the magnetic substrate.

The first face of the substrate may be ferromagnetic and/or ferrimagnetic and/or antiferromagnetic and made up, without exclusion, of one of the following elements: cobalt, and/or nickel, and/or iron, and/or an iron or cobalt alloy with 4d and/or 5d type metals such as palladium and/or platinum, and/or one or more magnetic oxides such as $Fe_3O_4$ or $TiO_{(2-x)}$. Said first face may be crystallized or of a crystalline structure, for example Co fcc(001), Fe cc(001), so as to allow the growth of protection layers with a compatible crystalline structure thereon.

When the substrate and the protection layer are crystallised, it is possible to carefully select the thickness of the protection layer for, by virtue of the formation of a quantum well state within the protection layer, better projecting the density of spin biased states, from the first face of the substrate, to the opposite face of the protection layer, in contact with the upper layer to be spin biased.

This crystallization condition is not limiting. Provided that the first face of the substrate is ferromagnetic, the substrate and/or its first face may be amorphous, as well as the protection layer.

Preferably, chemical bonds are established between the protection layer and the upper layer in order to better print the indirect exchange field, and/or the spin biased state density from the state quantizes in the protection layer, on the atomic sites of the first plane of atoms of the upper layer.

Advantageously, the protection layer is metallic, which enables low resistive devices to be manufactured, for example for nanotechnology purposes.

Advantageously, the protection layer enables the first face of the substrate to modify and control the magnetic properties of the atoms making up the first atom layer of the upper layer, in contact with said protection layer. This influence may possibly be extended in the upper layer, to deeper layers.

Advantageously, the substrate may include cobalt, the protection layer may include copper, and the upper layer may include MnPc. In such a configuration, the atomic sites of the molecules of the upper layer (not only Mn but also C and N of the Pc) have their paramagnetic moments characterised by a common magnetic order induced by the indirect exchange between the material of the upper layer and that of the substrate via the Cu of the protection layer, and this especially at room temperature and with a zero external magnetic field. From this actual ferromagnetism of these atomic sites, a non-zero average spin bias at the Fermi level results.

The method may further include a manufacturing of means for controlling the magnetism of the substrate and/or of the face of the substrate. Such controlling means enable, via controlling the magnetism of the substrate and/or of the face of the substrate, the magnetism of the interface between the protection layer and the upper layer to be controlled.

According to one alternative, the substrate of the spin injector device may be connected or attached to an intermediate device. The latter may be made up of a protection layer in contact with or on a substrate, as previously described. Both these devices may be interconnected through the protection layer of the intermediate device.

The present invention thus also relates to a method for manufacturing a device including implementing a method for manufacturing a spin injector device according to the invention, and wherein the spin injector device may be connected to an intermediate device including a second protection layer provided on a second substrate, the second protection layer of the intermediate device may be provided against the substrate or the upper layer of the spin injector device. This configuration offers the advantage of being able to control the spin bias of the electrical current passing through the spin injector device, but also to pre-cease the spin referential frame of the upper layer to a frequency in the gigahertz range.

According to another alternative, the upper layer of the spin injector device such as described above may be connected or attached to the protection layer of a preceding intermediate device.

The outer opposite layers of the previous devices may be connected to a current generator device.

The current generator device may be able to output a biased electrical current intended to pass through at least the protection layer of the spin injector device by being biased to at least 10%, or even values higher than about 20%, for an operating temperature higher than −50° C. This can thus be switched ON such that an electrical current passes through at least the protection layer of the spin injector device. The current outputted from the device may be biased at at least 5% or at least 10% or at least 20%, along a same direction, and for an operating temperature of the device higher than −50° C. and/or −20° C., and/or 0° C., and/or 50° C., and/or 150° C. and/or 250° C., and/or 500° C.

The present application also relates to spin injector devices including:
- a substrate including a face or first magnetic face and electrically conductive;
- a protection layer on the face of the substrate, so as to restrict or prevent oxidation and/or contamination of said face by its environment, the protection layer may be of a low magnetic or diamagnetic or paramagnetic nature;
- an upper layer on the protection layer, promoting transfer of biased electrons between said layer and the first face of the substrate.

The substrate may be connected or linked to an intermediate device, such as previously described, by the intermediate layer or the substrate of said intermediate device.

The outer and opposite layers of the preceding devices may be connected to a current generator device.

BRIEF DESCRIPTION OF THE DRAWINGS

Further details and characteristics of the invention will be more apparent from the description that follows, made in reference to the following appended figures. Identical, similar or equivalent parts of the different figures bear the same reference numerals so as to facilitate switching from one figure to another. Different parts represented in the figures are not necessarily drawn at a uniform scale, for making the figures more legible. The referential frames indicated in the figures are orthogonal.

DETAILED DISCLOSURE OF PARTICULAR EMBODIMENTS

One of the purposes of the present application is to facilitate the manufacture of a device for injecting biased spins into a material, when connected to a current source. This type of device is also known as spin injector device.

A manufacturing method is facilitated when it is adaptable to industrial requirements, that is easy, and/or fast, and/or economical to implement, while being reproducible on a large scale.

Figure 1:
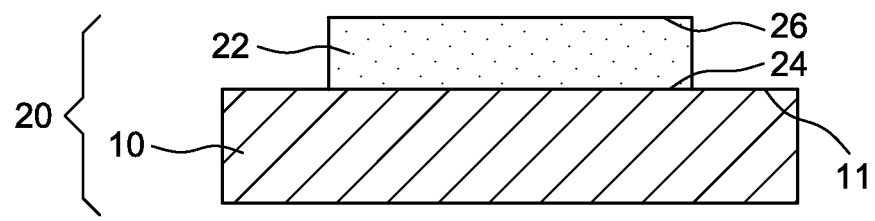
FIG. 1 represents a step of making a spin injector device.

A spin injector device 30 includes a first material, called substrate 10, which is electrically conducting and has magnetic properties. A first face 11 of the substrate 10 is in contact with the outer environment and has ferromagnetic and/or ferrimagnetic and/or antiferromagnetic type magnetic properties (FIG. 1).

The first face 11 of the substrate can for example include or be based on oxide(s) and/or nitride(s), and/or carbide(s), or based on cobalt and/or iron, and/or nickel. The term "based on" defines a volume proportion equal to or higher than 5% or 10% or 50% or 90% of the elements making up said first face 11 and/or the substrate 10.

The first face of the substrate 10 can be structured, preferably crystallized, so as to promote spin biased states at its surface, for an energy range between $-1\ eV<E-E_F<+1\ eV$, and likely to couple electronically to the states of the protection layer 22 described hereinafter.

When the first face of the substrate includes cobalt, it can have a face-centered cubic (fcc) type crystalline structure, the orientation of these crystallographic planes being defined by the following Miller indices (001).

The substrate 10, as well as the protection layer 22, are made by vacuum deposition according to the state of the industrial art (sputtering, electron beam deposition, thermal sublimation, etc.). The base vacuum quality of the body frame (lower than $1.10^{-8}$ mbar), as well as the small time elapsed between the end of the substrate 10 deposition and the start of the protection layer 22, may improve the chemical quality of the interface 24 resulting therefrom. Preferably, the first face 11 is of a planar surface.

The manufacturing method can include a second step of covering, at least partly, the first face 11 by an intermediate layer, called a protection layer 22. An intermediate device 20 is thus obtained.

The protection layer 22 can be amorphous or crystallized and its thickness, along a direction perpendicular or substantially perpendicular to the first face 11, can be higher than or equal to 1 monolayer and lower than 8 monolayers, or be between 1 and 3 monolayers of atoms making up said layer, preferably in the order of 2 monolayers. A monolayer is preferably parallel or substantially parallel to the first face 11.

The protection layer 22 can be made up of one or a combination of noble metals, such as for example Au, and/or Cu, and/or Ag, or any metal having a low reactivity to air and water. Preferably, the protection layer 22 is paramagnetic and can include a strong magnetic susceptibility.

Figure 2:
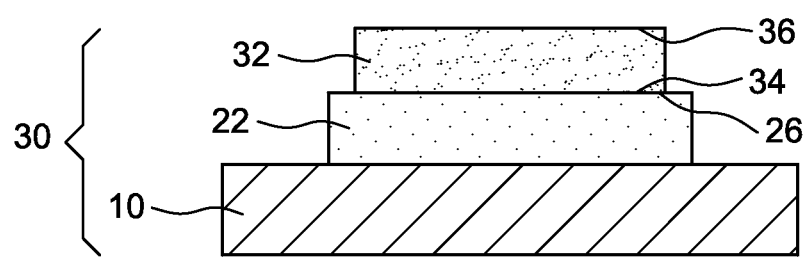
FIG. 2 represents a spin injector device.

The face 26, facing the face 24 of the protection layer 22 in contact with the first face 11 of the substrate 10, can be covered with a third material, forming an upper layer 32 (FIG. 2). A spin injector device 30 is then obtained.

Preferably, the upper layer 32 is of an organic nature, for example of the same nature as the organic layers for forming spin injectors (Phys. Rev. Lett. 105, 077201 (2010)).

Preferably, chemical bonds are established between the face 26 of the protection layer 22 and the face 24 of the upper layer 32 in order to better print the indirect exchange field, and/or the spin biased state density from the state quantises in the protection layer, on the atomic sites of the first plane of atoms of the upper layer.

One of the advantages of the invention, because of the presence of the protection layer 22 on the face 11, is that the composition of the organic layer can be more varied. It can include molecules which would degrade in a vacuum production. It can even include elements which would potentially degrade the spintronic performances of the face 11 in direct contact with the same. For example, the upper layer 32 can be made up of one or a combination of the following elements: tris(8-hydroxyquinoline)aluminium(III) (Alq3), porphyrin, phthalocyanin (Pc), 5,6,11,12-tetraphenylnaphthacen (rubren), perylene-3,4,9,10-tetracarboxylic dianhydride (PCTDA), tetracyanoethylene (TCNE), tetrathiafulvalene (TTF), tetracyanoquinodi-methane (TCNQ), Fe-phenanthroline, supramolecular metallogrids [Angew. Chem. Int. Ed. 2004, 43, 3644], carbon nanotubes, graphene).

Its thickness, along the direction perpendicular or substantially perpendicular to the first face 11 of the substrate 10, can be higher than 1 molecular plane and lower than 1000 nm, or be between 1 and 3 molecular planes, preferably in the order of 2 molecular planes.

Advantageously, the formation of the upper layer is not limited by particular requirements, more specifically to the preservation of the surface state of the face 11. Therefore, the upper layer 32 can be formed by one of the following techniques: thermal sublimation, of course and as an example of a "dry" technique, but also any "wet" technique such as drop-casting, spin-coating, Langmuir-Blodgett (A. Ulman, An Introduction to Ultrathin Organic Films From Langmuir-Blodgett to Self-Assembly, Academic Press, Inc.: San Diego (1991)). Most of these techniques are already used at the industrial scale, thus they are simple to implement and inexpensive.

Several alternatives of the preceding manufacturing methods will now be described.

Figure 3:
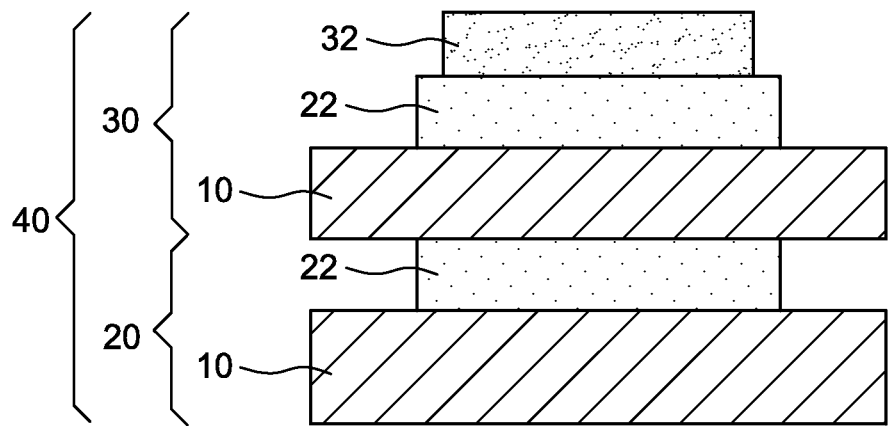
FIG. 3 represents a first alternative of a spin injector device.

According to a first alternative, a spin injector device 30 can be placed above an intermediate device 20 (FIG. 3). The protection layer 22 of the intermediate device 20 can possibly be in contact with the substrate 10 of the spin injector device.

This protection layer 22 can be substituted by a non-conductive layer, allowing diffusive transport. In this case, a substrate 10 such as Co and a protection layer 22 such as Si or GaAs can be used. The non-conducting protection layer 22 can also allow tunnel effect transport of biased spins between both substrates 10 of the device 40. In this case, substrates 10 such as Co or $Ni_{80}Fe_{20}$ and protection layers 22 such as $Al_2O_3$ (Fert, Nobel Lectures 2008 Angew. Chem. Int. Ed. 2008, 47, 5956-5967) or even $SiO_2$ (PHYSICAL REVIEW B73, 172402 (2006)) can for example be used. Preferably, the substrate 10 of the spin injector device 30 is less coercive than the substrate 10 of the intermediate device 20, such that it is possible to obtain parallel and anti-parallel magnetization states of both substrates 10, by virtue of the torque effect spin transfer, which reflects the action of the spin momentum of the biased current (with as referential frame, that of the layer having the strongest coercive field) on the magnetization of the layer having the lowest coercive field (Fert, Nobel Lectures 2008 Angew. Chem. Int. Ed. 2008, 47, 5956-5967f).

Thus, the intermediate device 20 can influence or control the behaviour of the spin injector device 30, and particularly the magnetization referential frame of the upper layer 32, by controlling the magnetization thereof via the direction of propagation of the biased current through the device 40.

The arrangement represented in FIG. 3 has the advantage of being able to control the spin bias of the electrical current passing through the spin injector device, either statically, or dynamically in the Gigahertz frequency domain. In the second case, this reflects the action of the spin angular momentum on the magnetization referential frame of the less coercive substrate, which then comes into precession in this frequency domain (Fert, Nobel Lectures 2008 Angew. Chem. Int. Ed. 2008, 47, 5956-5967).

Figure 4:
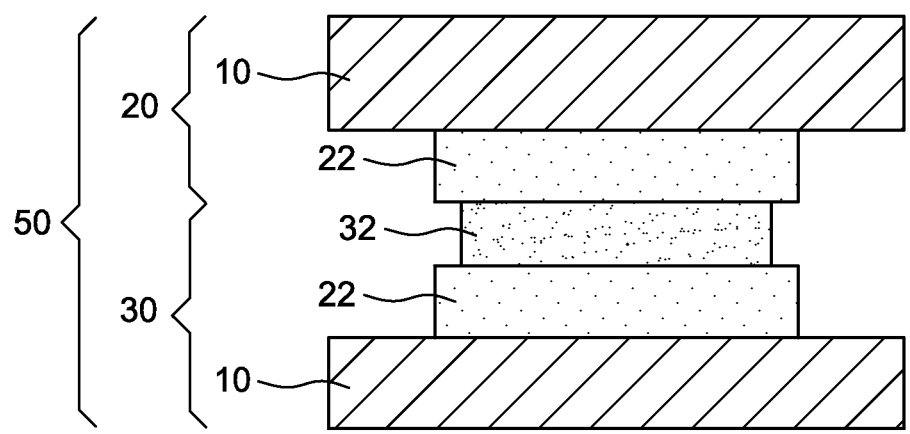
FIG. 4 represents a second alternative of a spin injector device.

According to a second alternative, an intermediate device 20 can be assembled with a spin injector device 30, so as to form a tunnel effect device 50, including an organic layer 32 between two conducting and magnetic substrates 10 (FIG. 4). When the upper layer 22 is organic, the deposition of metal layers onto this layer can be made when cold in order to improve the structural and chemical quality of the upper layer 22.

The above methods can include a step of electrically connecting the peripheral layers of the devices 30, 40 and 50, with an electrical current generator device. The generator can be switched on to allow a spin biased current to pass through the protection layer 22 and the upper layer 32. By allowing a sufficient electrical current to pass through the devices 40 and 50, it will be possible to modify the relative magnetization orientation of the ferromagnetic layers. Preferably, more than 5% or 10% or 50% or 70% or higher than 70% of electrons passing through these layers have the same spin type. This bias rate is maintained for operating temperatures of the device higher than −50° C., or 0° C., or 50° C., or 150° C., or 250° C. or 500° C.

The above methods are distinct in particular from the state of the art, by sandwiching a protection layer 22 between a substrate 10 and an upper layer 32 (FIGS. 2, 3 and 4). The protection layer 22 has at least one of the following functions:
  protecting the first face 11 of the substrate 10 from any oxidation and/or contamination phenomena;
  and/or disturbing as little as possible the magnetic properties of the substrate 10 and/or of the first face 11;
  and/or promoting the hybridisation of the upper layer 32 to its surface 26, so as to allow the first face 11 of the substrate 10 to bias to at least 5% or 10% or 50% or 70% or higher than 70% the first atomic layer making up the face 34 of the upper layer, in contact with the protection layer 22;
  and/or controlling the magnetic coupling effects between the substrate 10 and the upper layer 32.

Preferably, the protection layer 20 is of the nature not to be degraded by exposure to air and/or water. It can thus be made of noble metals.

The selection of the materials employed to make the above devices (30, 40, 50), can be made as a function of the properties of the first face 11 of the substrate and/or of the protection layer 22 and/or of the upper layer 32.

When the protection layer is made up from an artificial alloy.

The selection of the thickness of the protection layer 22 can be made as a function of its composition and the composition of the face 11 in contact with said layer (J. Phys.: Condens. Matter 14(2002) R169-R193; Applied Surface Science, Volumes 162-163, 1 Aug. 2000, Pages 78-85; a more general ref: Nanomagnetism: Ultrathin Films, Multilayers and Nanostructures Vol. 1 Chap. 3 p. 61 (2006)).

TABLE 1

| Composition of the first face 11 | Composition of the protection layer 22 | Thickness of the protection layer 22 in monolayers (ML) or Angstrom (A) |
|---|---|---|
| Fe (100) | Ag | 2.37 ± 0.07 ML |
|  |  | or 4.85 ± 0.14 A |
|  |  | 5.73 ± 0.05 ML |
|  |  | or 11.72 ± 0.1 A |
| Fe (100) | Au | 2.48 ± 0.05 ML |
|  |  | or 5.06 ± 0.1 A |
|  |  | 8.6 ± 0.3 ML |
|  |  | or 17.54 ± 0.2 A |
| Co (100) | Cu | 2.67 ML |
|  |  | or 4.8 A |
|  |  | 5.88 ML |
|  |  | or 10.6 A |

This selection of thickness, which should take into account epitaxy requirements of the layers 10 and 20 on the initial substrate, but also the accurate phase accumulation at the interface between the protection layer 22 and the upper layer 32, can also be optimized in order to take into account the operating temperature of the device (Rep. Prog. Phys. 65(2002) 99-141). The thickness of the protection layers disclosed in Table 1 can have a multiple value of said values, in order to promote the magnetic coupling phenomenon between the first face 11 and the upper layer 32 (Physical Review Letter, 80, 1754 (1998)). This phenomenon remains up to thicknesses of the protection layer of 130 monolayers (Applied Surface Science, Volumes 162-163, 1 Aug. 2000). However, the intensity of the exchange coupling decreases when the thickness increases (Nanomagnetism: Ultrathin Films, Multilayers and Nanostructures Vol 1 Chap. 3 p. 61 (2006)). Preferably, the thickness of the protection layer, according to previously set out criteria, will thus remain low.

Table 1 shows some concrete examples of the substrate 10/protection layer 22 pair. With the proviso that the protection layer is not degraded in contact with air and/or water, any pair fulfilling besides some spintronics conditions (interlayer exchange coupling, states of spin biased quantised wells (Fert, Nobel Lectures 2008 Angew. Chem. Int. Ed. 2008, 47, 5956-5967, Nanomagnetism: Ultrathin Films, Multilayers and Nanostructures Vol 1 Chap. 3 p. 61 (2006))) can be used. There can be mentioned for example as the substrates 10 one of the following elements: Fe(100), Fe(111), Co(100), Co(111), Ni(100), Ni(111), hcp Co(0001), associated with a protection layer 22 made of one of the following elements: Ag(100), Ag(111), Cu(100), Cu(111), Au(100), Au(111).

The above manufacturing methods have in particular the following advantages:
  the substrate 10, once covered by the protection layer 22, can be stored or transferred into oxidizing or wet environments, without the magnetization properties of its first face 11 being decreased;
  the deposition of the upper layer onto the intermediate device 20 can be performed in oxidizing atmosphere environments or having a nature as to degrade the spintronic properties of the substrate 10 and its upper face 11;

the upper layer 32, the chemical nature of which could have, in direct contact with the substrate 10, degraded the properties of the surface 11 of the substrate 10, can now be integrated in a spintronic device by virtue of the protection layer 22;

the spintronic properties of the surface 11 of the substrate 10 can be qualitatively (that is in terms of the presence of a spin bias from a spin referential frame controlled by the magnetization of the substrate 10) offset to the upper layer 32, enabling the substrate 10 to spintronically control an upper layer located in an environment otherwise detrimental to the spintronic properties of the surface 11 of the substrate 10.

The present application also relates to the devices obtained from one of the previous manufacturing methods.

A first device is a spin injector 30, including an intermediate layer 20 interposed between or separating a substrate 10 and an upper layer 32 (FIG. 2).

A second device 40 is an offset spintronic driving organic layer, including a spin injector 30 placed above an intermediate device 20 (FIG. 3).

A third device 50 is a protective organic spintronic junction. It includes at least one spin injector 30, whose face 36 of the upper layer 32, facing and opposite the face 26 of the protection layer, is covered with a conducting and magnetic element, such as for example the substrate 10. Preferably, the intermediate layer 32 is separated from both substrates 10 of the device 50 by a protection layer 22 (FIG. 4).

The characteristics of these devices are identical or similar to the characteristics mentioned for their manufacturing methods.

The outer and opposite elements of the previous devices (10, 32) can be electrically connected to an intensity source, so as to allow an electrical current to pass through the upper layer 32.

Advantageously, these devices enable the magnetization, and thus the spin bias referential frame, of an upper layer 32 to be controlled by virtue of a magnetic substrate 10 protected from the upper layer 32, or even from the environment (air, water) of the upper layer 32. The use of a metal protection layer enables these devices to be of low resistivity.

All the previously described devices can include means for controlling the magnetism of the substrate 10 and/or of the face 11 of the substrate 10 enabling to act and control the magnetic referential frame of the substrate 10. This can for example be achieved via means for applying to the substrate a magnetic, electrical, electromagnetic field, a mechanical expansion and/or contraction of the substrate, or even a temperature change of the magnetic substrate. The control of the magnetism of the substrate 10 thus enables to control the intensity and spin bias in the upper layer 32.

The invention claimed is:

1. A method for manufacturing a spin injector device, comprising the following steps of:
   a) forming a metal protection layer on a face of a substrate, so as to restrict or prevent oxidation and/or contamination of said face by its environment, the face of the substrate being magnetic and electrically conductive, the protection layer being of a diamagnetic or paramagnetic nature;
   b) forming an upper layer onto the protection layer to promote a spin bias of electronic states in the vicinity of the Fermi level of the interface between the protection layer and the upper layer according to an amplitude and a spin referential frame which are defined by the magnetism of the substrate and/or of the face of the substrate, the upper layer being an organic layer of which one or more molecular sites have, in contact with the protection layer, a paramagnetic moment characterized by a single magnetic referential frame, fixed in space and time and based on a magnetic referential frame of the substrate and/or of the face of the substrate.

2. The method for manufacturing a spin injector device according to claim 1, wherein the protection layer is made of one or several noble metals.

3. The method for manufacturing a spin injector device according to claim 1, wherein the thickness of the protection layer, along a direction substantially perpendicular to the face of the substrate, is between one and one hundred thirty thicknesses of an atom layer making up said protection layer.

4. The method for manufacturing a spin injector device according to claim 1, wherein the upper layer includes at least one of the following elements: carbon, nitrogen, oxygen, fluorine, boron, iron, cobalt, manganese, copper, vanadium, zinc, magnesium, silicon.

5. The method for manufacturing a spin injector device according to claim 1, wherein the face of the substrate includes at least one of the following elements: cobalt, and/or nickel, and/or iron, and/or an iron or cobalt alloy with 4d and/or 5d type metals, and/or one or more magnetic oxides.

6. The method for manufacturing a spin injector device according to claim 1, wherein the face of the substrate is crystallized.

7. The method for manufacturing a spin injector device according to claim 1, wherein the face of the substrate is amorphous.

8. The method for manufacturing a spin injector device according to claim 1, further including a manufacturing of means for controlling the magnetism of the substrate and/or of the face of the substrate.

9. A method for manufacturing a device including implementing a method for manufacturing a spin injector device according to claim 1, and wherein the spin injector device is connected to an intermediate device including a second protection layer provided on a second substrate, the second protection layer of the intermediate device being provided against the substrate or the upper layer of the spin injector device.

10. The manufacturing method according to claim 9, wherein the outer opposite layers of the device are connected to a current generator device.

11. The manufacturing method according to claim 10, wherein the current generator device is able to output a spin biased electrical current for passing through at least the protection layer of the spin injector device having a spin polarization p equal to at least 10% for an operating temperature higher than −50° C., wherein the spin polarization p is defined as $p=(N_{up}-N_{down})/(N_{up}+N_{down})$, with $N_{up}$ the carrier density for spin up electrons and $N_{down}$ the carrier density for spin down electrons.

12. The manufacturing method according to claim 1, wherein the outer opposite layers of the device are connected to a current generator device.

13. The manufacturing method according to claim 10, wherein the current generator device is able to output a spin biased electrical current for passing through at least the protection layer of the spin injector device having a spin polarization p equal to at least 10% for an operating temperature higher than −50° C., wherein the spin polarization p is defined as $p=(N_{up}-N_{down})/(N_{up}+N_{down})$, with $N_{up}$ the carrier density for spin up electrons and $N_{down}$ the carrier density for spin down electrons.

* * * * *